(12) United States Patent
Kazi et al.

(10) Patent No.: US 7,525,387 B2
(45) Date of Patent: Apr. 28, 2009

(54) AMPLIFIER CIRCUIT

(75) Inventors: Zaman Iqbal Kazi, Kyoto (JP); Junji Ito, Osaka (JP); Toshihiro Shogaki, Osaka (JP)

(73) Assignee: Panasonic Corporation, Osaka (JP)

( * ) Notice: Subject to any disclaimer, the term of this patent is extended or adjusted under 35 U.S.C. 154(b) by 60 days.

(21) Appl. No.: 11/808,256

(22) Filed: Jun. 7, 2007

(65) Prior Publication Data
US 2008/0001675 A1 Jan. 3, 2008

(30) Foreign Application Priority Data
Jun. 9, 2006 (JP) ............ P.2006-161067

(51) Int. Cl.
*H03F 3/04* (2006.01)
(52) U.S. Cl. ............ 330/296; 330/288; 330/307
(58) Field of Classification Search ........... 330/296, 330/288, 307
See application file for complete search history.

(56) References Cited
U.S. PATENT DOCUMENTS

| | | | |
|---|---|---|---|
| 6,404,287 B2 * | 6/2002 | Dening et al. ............... 330/296 |
| 6,492,874 B1 * | 12/2002 | Shih ............................. 330/288 |
| 6,788,150 B2 * | 9/2004 | Joly et al. .................... 330/296 |
| 6,922,107 B1 * | 7/2005 | Green ........................... 330/296 |
| 6,990,323 B2 * | 1/2006 | Prikhodko et al. ........... 455/126 |
| 7,064,614 B2 * | 6/2006 | Feng et al. .................... 330/296 |

OTHER PUBLICATIONS

Fujita, Yasuhiro et al., "Technology for Semiconductor Circuit Design," Nikkei Business Publications, Inc., Apr. 4, 1987, p. 233-275.

* cited by examiner

*Primary Examiner*—Patricia Nguyen
(74) *Attorney, Agent, or Firm*—McDermott Will & Emery LLP

(57) ABSTRACT

An amplifier circuit includes a first bipolar transistor of which the emitter is connected to the ground, and a bias circuit of the first bipolar transistor. The bias circuit includes a second bipolar transistor constituting a current mirror circuit along with the first bipolar transistor, a first resistor connected to the bases of the first bipolar transistor and the second bipolar transistor, and a third bipolar transistor of which the emitter is connected to the bases of the first bipolar transistor and the second bipolar transistor through the first resistor, and of which the base is connected to the collector of the second bipolar transistor. The first bipolar transistor amplifies a signal input to the base thereof and then outputs the amplified signal from the collector of the first bipolar transistor.

28 Claims, 11 Drawing Sheets

1

AMPLIFIER CIRCUIT

BACKGROUND OF THE INVENTION

The present invention relates to an amplifier circuit having an excellent NF characteristic in a high frequency range.

In the field of radio communication systems, a high-power signal is often received while a low-power signal is received. In particular, in portable receivers and vehicle-mounted receivers such as a keyless entry system or a cellular phone, the intensity of a signal received by an antenna is very weak. Thus, in order to avoid an influence on an intensity variation of the received signal, a low noise amplifier (LNA) for amplifying the weak signal is provided to a receiving system.

When such a receiver includes an integrated circuit (IC), various special design restrictions have to be taken in circuit designs, such as prevention of a DC current variation in a current amplification factor ($h_{FE}$) of the radio frequency (RF) devices due to the manufacture instability of a transistor, which affects major RF characteristics, such as the gain noise factor of an LNA. That is, an amplifier circuit should be stable in an output current of the collector even $h_{FE}$ of the RF device is unstable. Therefore, in order to obtain an output current proportional to the input current, a current mirror circuit including a passive element for preventing the leakage of an RF signal is used in a bias circuit (e.g., see Non-Patent Document 1).

FIG. 11 is a circuit diagram illustrating an LNA as a related art. The LNA shown in FIG. 11 generally includes a transistor Q1 of which the emitter is connected to the ground and a bias circuit 10. The transistor Q1 amplifies an input signal from an input terminal 11 connected to the base of the transistor Q1 via a coupling capacitor C1. The output is got as an amplified signal from an output terminal 13 connected to the collector of the transistor Q1 through a coupling capacitor C2. A coil L is connected to the collector of the transistor Q1 in parallel to the transistor Q1.

The bias circuit 10 includes a transistor Q2, a transistor Q3, and a resistor Re. The transistor Q1 and the transistor Q2 form a current mirror circuit. The bases of the transistor Q1 and the transistor Q2 are connected to the emitter of the transistor Q3. The emitter of the transistor Q2 is connected to the ground through the resistor Re. The resistor Re is provided to increase the input impedance of the bias circuit 10 greater than the input impedance of the transistor Q1.

The collector of the transistor Q2 and the base of the transistor Q3 are connected to each other, and are supplied with a current from a constant current source 21. The voltage from a voltage source Vcc2 is applied to the collector of the transistor Q3. A capacitor Cf for filtering a noise is connected to the collector of the transistor Q2 and the base of the transistor Q3.

A function of the bias circuit can be implemented by the configuration in which the collector and the base of the transistor Q1 are connected via a resistor. However, the collector current of the transistor Q1 does not change even if the above-mentioned bias circuit 10 is unstable in the current amplification factor ($h_{FE}$) of the transistor Q1 due to the manufacture instability. In other words, the LNA having the bias circuit including a current mirror circuit allows obtaining more stable output current characteristic than that of the LNA having the bias circuit including only a resistor.

[Non-Patent Document 1] "Technology for Semiconductor Circuit Design", Nikkei Business Publications, Inc., Apr. 4, 1987, p. 233-275, written by FUJITA Yasuhiro, SUMI Tatsumi, KATSUYAMA Takashi and WAKAI Shuzo, supervised by TAMAI Tokumichi.

In the aforementioned LNA, when a high frequency signal is input from the input terminal 11, a high-frequency signal is leaked to the base of the transistor Q2 or the emitter of the transistor Q3. The high-frequency signal leaked to the emitter of the transistor Q3 affects the transistor Q3, even though the high-frequency signal leaked to the base of the transistor Q2 is filtered by the capacitor Cf. In addition, the noises from the voltage source Vcc1 or the constant current source 21 affect the transistors Q1 through Q3.

As a result, the noise figures (NF) of the LNA in the high frequency area is deteriorated, that is, an NF is increased. Hence, the LNA having an excellent NF characteristic even in a high-frequency area is desired. In a power-up circuit disposed in a transmission system as well as the LNA, equally, there is a need for a power-up circuit having an excellent NF characteristic even in a high frequency area. It is desirable that the output current characteristic is stably maintained.

SUMMARY OF THE INVENTION

An object of the invention is to provide an amplifier circuit having an excellent NF characteristic in a high frequency area.

According to an aspect of the invention, there is provided an amplifier circuit, including a first bipolar transistor of which the emitter is grounded; and a bias circuit of the first bipolar transistor, wherein the bias circuit including a second bipolar transistor constituting a current mirror circuit along with the first bipolar transistor, a first resistor connected to the bases of the first bipolar transistor and the second bipolar transistor, and a third bipolar transistor of which the emitter is connected to the bases of the first bipolar transistor and the second bipolar transistor through the first resistor, and of which the base is connected to the collector of the second bipolar transistor, and wherein the first bipolar transistor amplifies a signal input to the base thereof and then outputs the amplified signal from the collector of the first bipolar transistor.

Preferably, in the amplifier circuit, a voltage may be applied from a voltage source to the collector of the third bipolar transistor and the bias circuit may have a second resistor connected to the collector of the third bipolar transistor.

Preferably, in the amplifier circuit, a current may be applied from a constant current source to the collector of the second bipolar transistor and the base of the third bipolar transistor, and the bias circuit may have a third resistor connected to the base of the third bipolar transistor.

Preferably, in the amplifier circuit, a voltage may be applied from a voltage source to the collector of the third bipolar transistor and the bias circuit may have a second resistor connected to the collector of the third bipolar transistor, and a current may be applied from a constant current source to the collector of the second bipolar transistor and the base of the third bipolar transistor, and the bias circuit may have a third resistor connected to the base of the third bipolar transistor.

Preferably, in the amplifier circuit, the bias circuit may have a fourth resistor connected to the emitter of the second bipolar transistor, and the emitter of the second bipolar transistor may be connected to the ground via the fourth resistor.

Preferably, the amplifier circuit may have a capacitor connected to the collector of the second bipolar transistor.

Preferably, the amplifier circuit may include a plurality of the first bipolar transistors, and the plurality of first bipolar transistors may be disposed in parallel to the second bipolar transistor.

Preferably, the amplifier circuit may be include a plurality of the second bipolar transistors, and the plurality of second bipolar transistors may be disposed in parallel to the first bipolar transistor.

Preferably, in the amplifier circuit, the first bipolar transistor and the second bipolar transistor may be a heterostructure bipolar transistor.

Preferably, in the amplifier circuit, the bias circuit may have a fifth resistor connected between the base of the second bipolar transistor and the first resistor.

Preferably, in the amplifier circuit, the bias circuit may have a sixth resistor connected between the base of the first bipolar transistor and the first resistor.

The amplifier circuit may be an integrated circuit in which the first bipolar transistor and the bias circuit may be integrated in a single chip.

The amplifier circuit related to the invention has an excellent NF characteristic in a high frequency area, since the first resistor prevents a leak of the input signal toward the third bipolar transistor.

DETAILED DESCRIPTION OF THE PREFERRED EMBODIMENTS

Specific embodiments of an amplifier circuit related to the invention will be described hereafter with reference to the accompanying drawings, taken the low noise amplifiers (LNA) as an example. The LNA is provided to, for example, a receiving system of a cellular phone, and amplifies the high frequency RF signal received by an antenna.

First Embodiment

Figure 1:
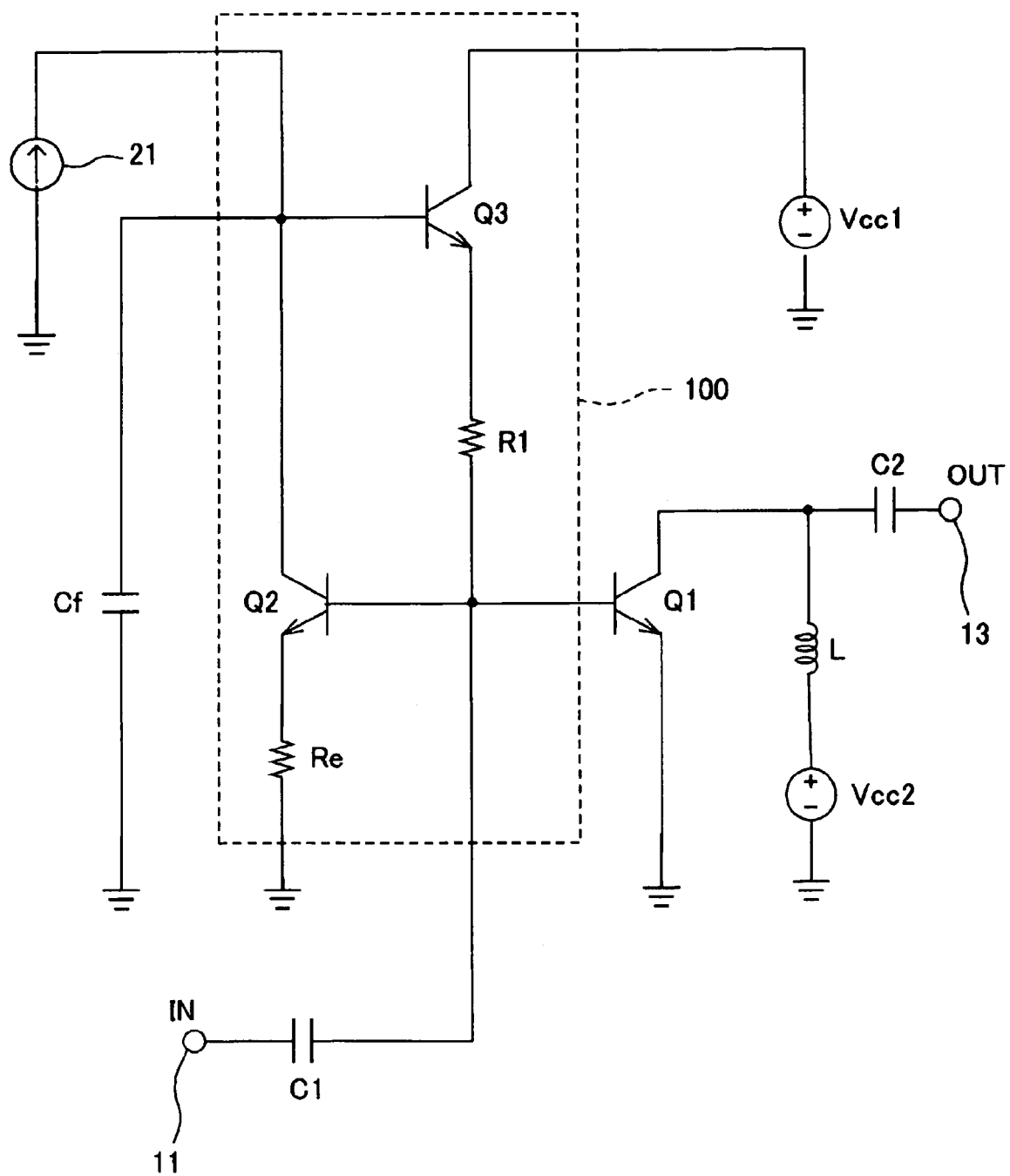
FIG. 1 is a circuit diagram illustrating the LNA according to the first embodiment.
Figure 11:
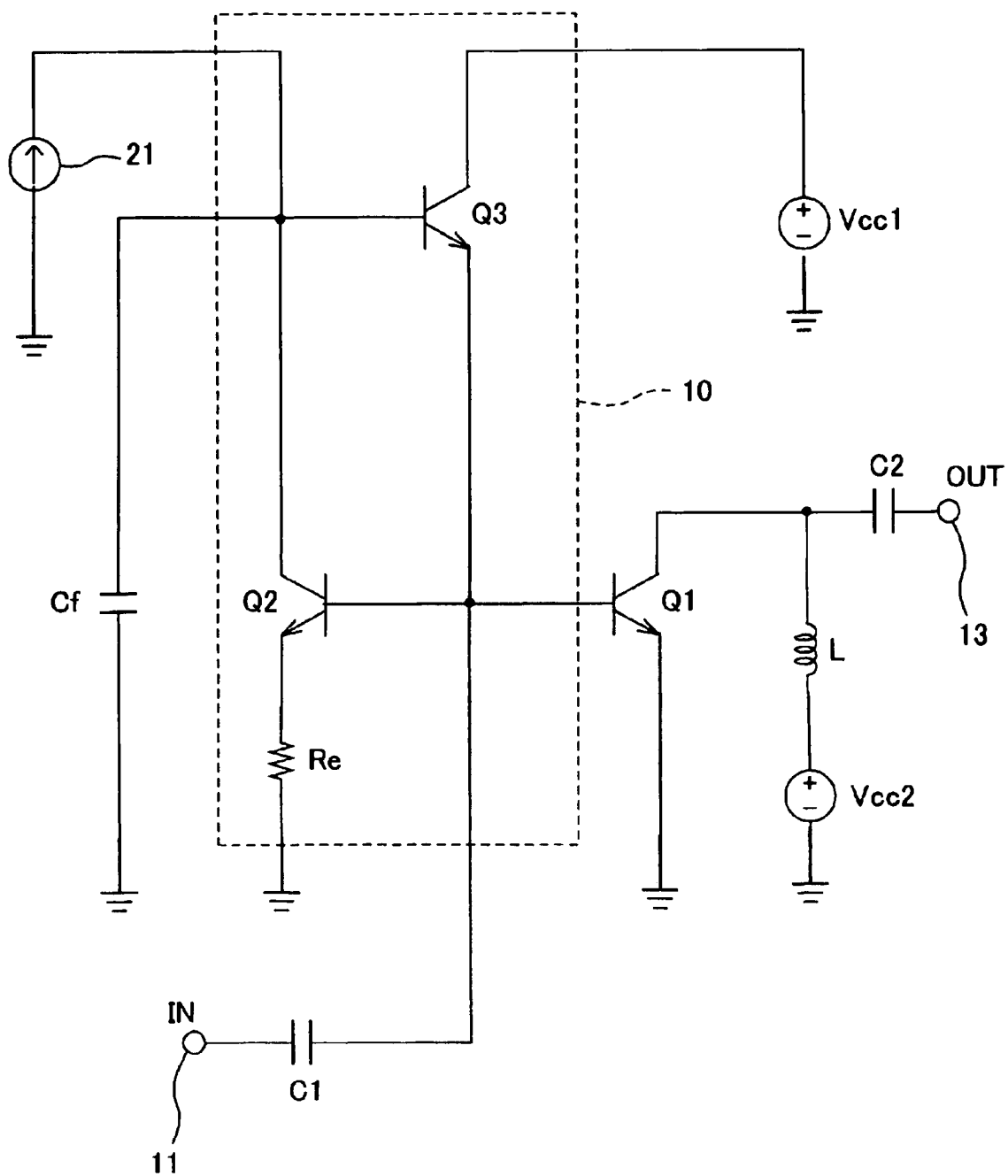
FIG. 11 is a circuit diagram illustrating an LNA as a related art.

FIG. 11 is a circuit diagram illustrating an LNA as a related art. As shown in FIG. 1, the LNA according to the first embodiment generally includes a transistor Q1 of which the emitter is connected to the ground, and a bias circuit 10. The LNA of FIG. 1 differs from the LNA of FIG. 11 in the configuration of the bias circuit. In FIG. 1, the same reference numerals are denoted to the same components as in FIG. 11. The LNA is formed in a known manner as an integrated circuit (IC) device which uses the heterojunction bipolar transistor (HBT) formed by epitaxially growing silicon or germanium layers on silicon substrates. For clarity, the illustration thereof will be omitted.

The transistor Q1 amplifies a RF signal input from an input terminal 11 connected to a base of the transistor Q1 via the coupling capacitor C1. The amplified signal is output from the output terminal 13 connected to the collector of transistor Q1 via the coupling capacitor C2. The coil L is connected to the collector of the transistor Q1 in parallel to the transistor Q1.

The bias circuit 100 includes a transistor Q2, a transistor Q3, and a resistor Re. The transistor Q1 and the transistor Q2 compose a current mirror circuit. The bases of the transistor Q1 and the transistor Q2 is connected to an emitter of the transistor Q3 via the resistor R1. The emitter of the transistor Q2 is connected to the ground through the resistor Re. The resistor Re is provided to increase the input impedance of the bias circuit 100 greater than the input impedance of the transistor Q1.

The collector of the transistor Q2 and the base of the transistor Q3 are connected to each other, and a current is supplied from a constant current source 21 thereto. The voltage from a voltage source Vcc1 is applied to the collector of the transistor Q3. In addition, a capacitor Cf for filtering a noise is connected to the collector of the transistor Q2 and the base of the transistor Q3.

According to the embodiment, the resistor R1 is connected between the bases of the transistors Q1 and Q2, and the emitter of the transistor Q3. The leakage of the RF signal input from input terminal 11 toward the emitter part of transistor Q3 can be prevented, since the impedance of the transistor Q3 part is increased by resistor R1. As a result, the bias circuit 100 is not affected by high frequency noises. In addition, the noise from the voltage source Vcc1 or the constant current source 21 do not affect to the transistor Q1.

Figure 2:
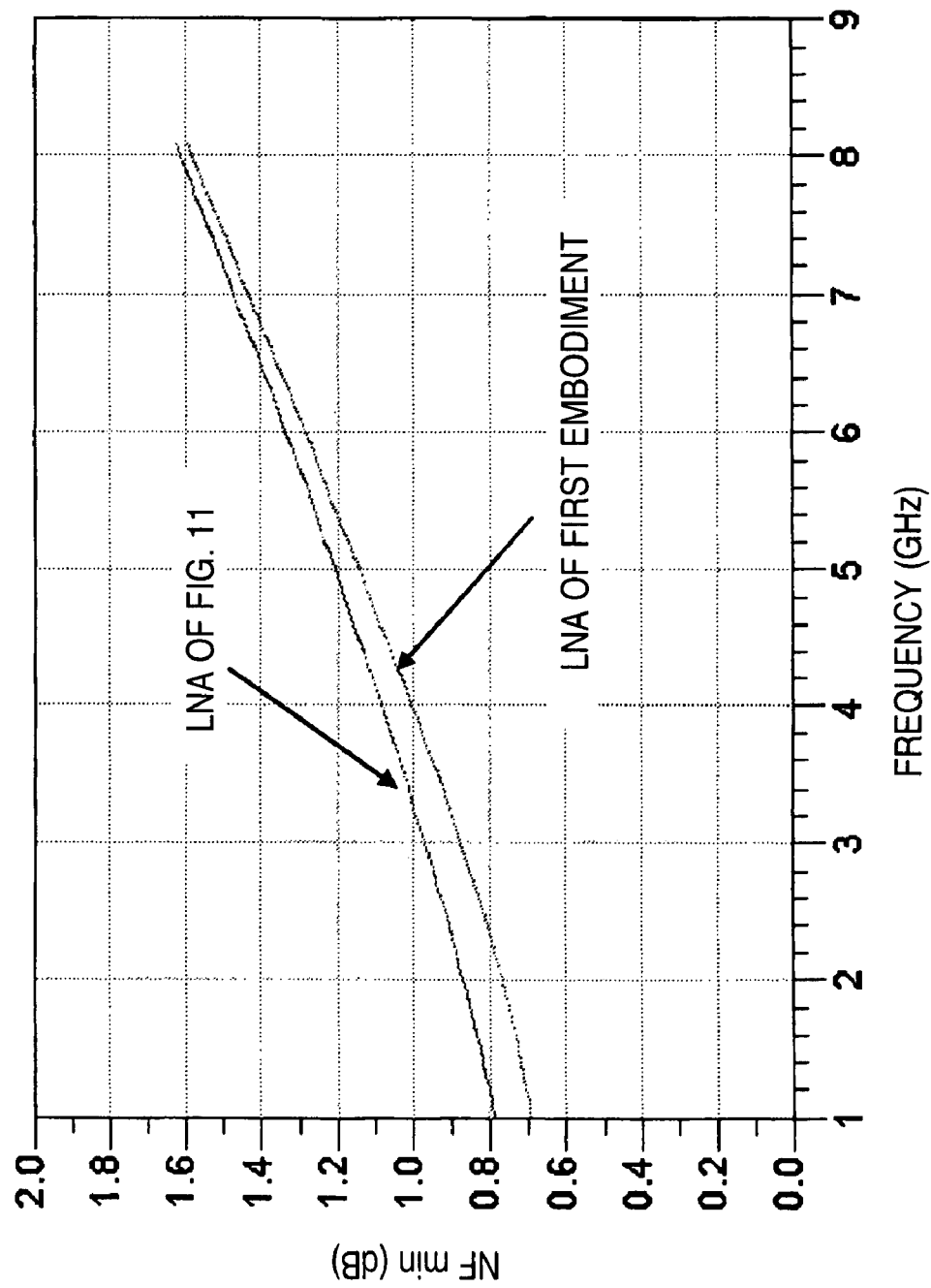
FIG. 2 is a view illustrating the minimum noise figures (NFmin) in the LNAs of the first embodiment and FIG. 11 over the high frequency areas (the range of 1 GHz to 8 GHz).

FIG. 2 is a view illustrating the minimum noise figures (NFmin) in the LNAs of the first embodiment and FIG. 11 over the high frequency areas (the range of 1 GHz to 8 GHz). As shown in FIG. 2, the LNA of this embodiment has a good NF characteristic than that of the LNA of FIG. 11 over the entire high frequency area. Thus, the LNA of this embodiment has an excellent NF characteristic even in a high frequency area, compared with the LNA of FIG. 11.

Figure 3:
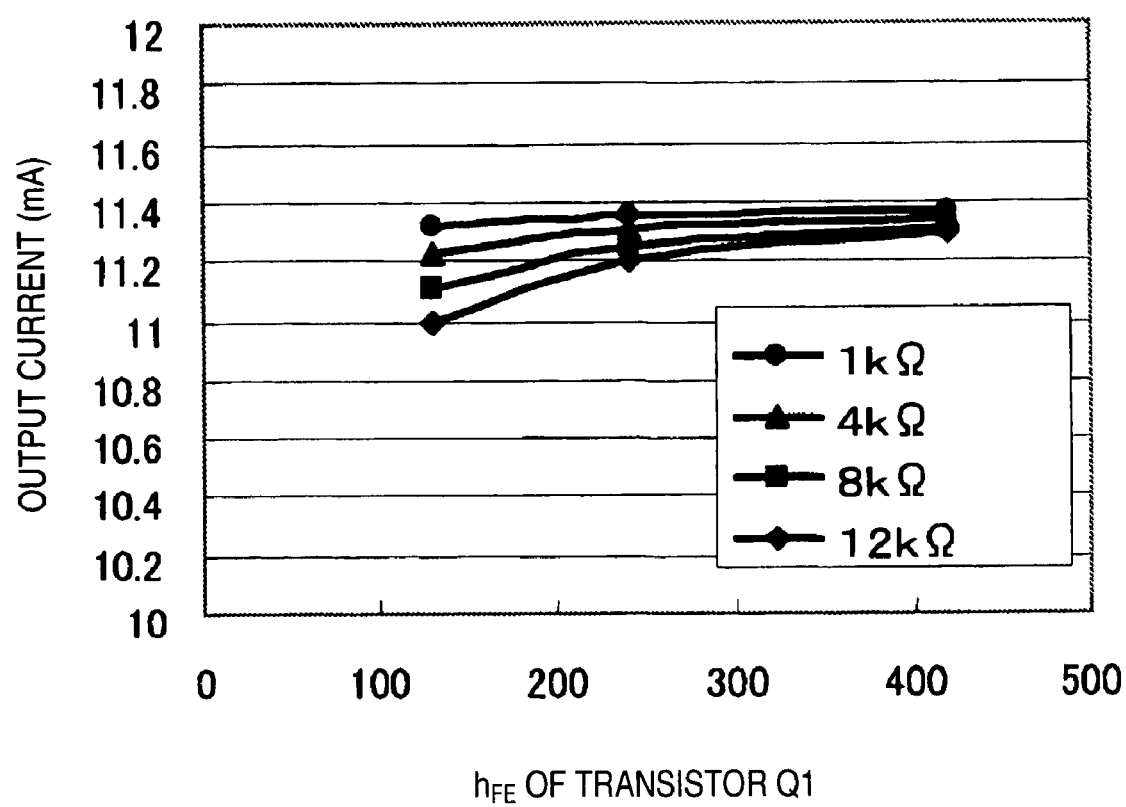
FIG. 3 is a view illustrating the output current level of the LNA with respect to the current amplification factor ($h_{FE}$) of the transistor Q1, for every 4 different resistance values of the resistor R1.

The output current characteristic of the LNA is affected depending on the resistor values of the resistor R1. FIG. 3 is a view illustrating the output current level of the LNA with respect to the current amplification factor ($h_{FE}$) of the transistor Q1, for every 4 different resistance values of the resistor R1. As shown in FIG. 3, there is a tendency that the output current characteristic in the $h_{FE}$ of the manufacture instability of the transistor Q1 is more unstable, as a resistor value of resistor R1 is increased. Thus, the resistance value of the resistor R1 preferably may be small in view of the stability of the output current characteristic. However, if the resistance value of the resistor R1 is too small, the leak of the high frequency signal toward the bias circuit 100 cannot be prevented. Thus, at the time of determining the resistance value of the resistor R1, the resistance value R1 should be determined in view of the balance between the preventing of the leakage of the high frequency signal toward the bias circuit 100 and the stability of the output current characteristic.

According to this embodiment, by forming the resistor R1 on the empty area of a substrate on which IC is mounted and by connecting wires so as to take desired values for the wiring design processes, the incorporation of the resistor R1 onto the circuit can be realized. Hence, considering unnecessary radiation or thermal characteristic etc, it is desirable that this resistance value R1 is determined.

Second Embodiment

Figure 4:
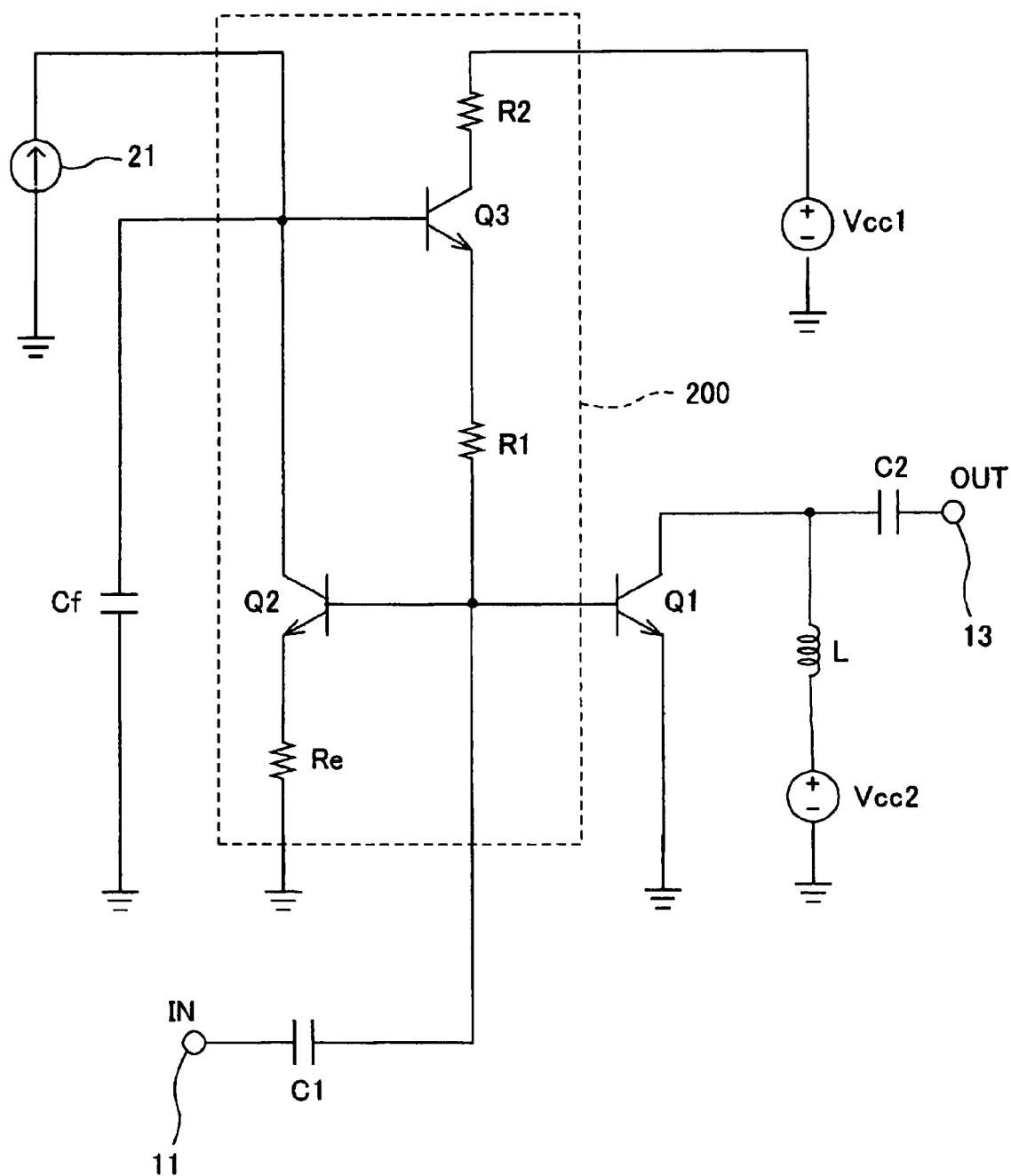
FIG. 4 is a circuit diagram illustrating the LNA according to the second embodiment.

FIG. 4 is a circuit diagram illustrating the LNA according to the second embodiment. The LNA of the second embodiment differs from the LNA of the first embodiment, in that the resistor R2 is connected to the collector of transistor Q3 in the bias circuit 200. The configuration of the second embodiment is the same as the first embodiment, besides the aforementioned facts. In FIG. 4, the same reference numerals are denoted to the same components in FIG. 1 and the description thereof will be omitted.

According to this embodiment, the resistor R2 is provided between the collector of the transistor Q3 and the constant voltage sources Vcc1. Thus, the transistor Q3 is not affected by noises from the constant voltage source Vcc1.

Figure 5:
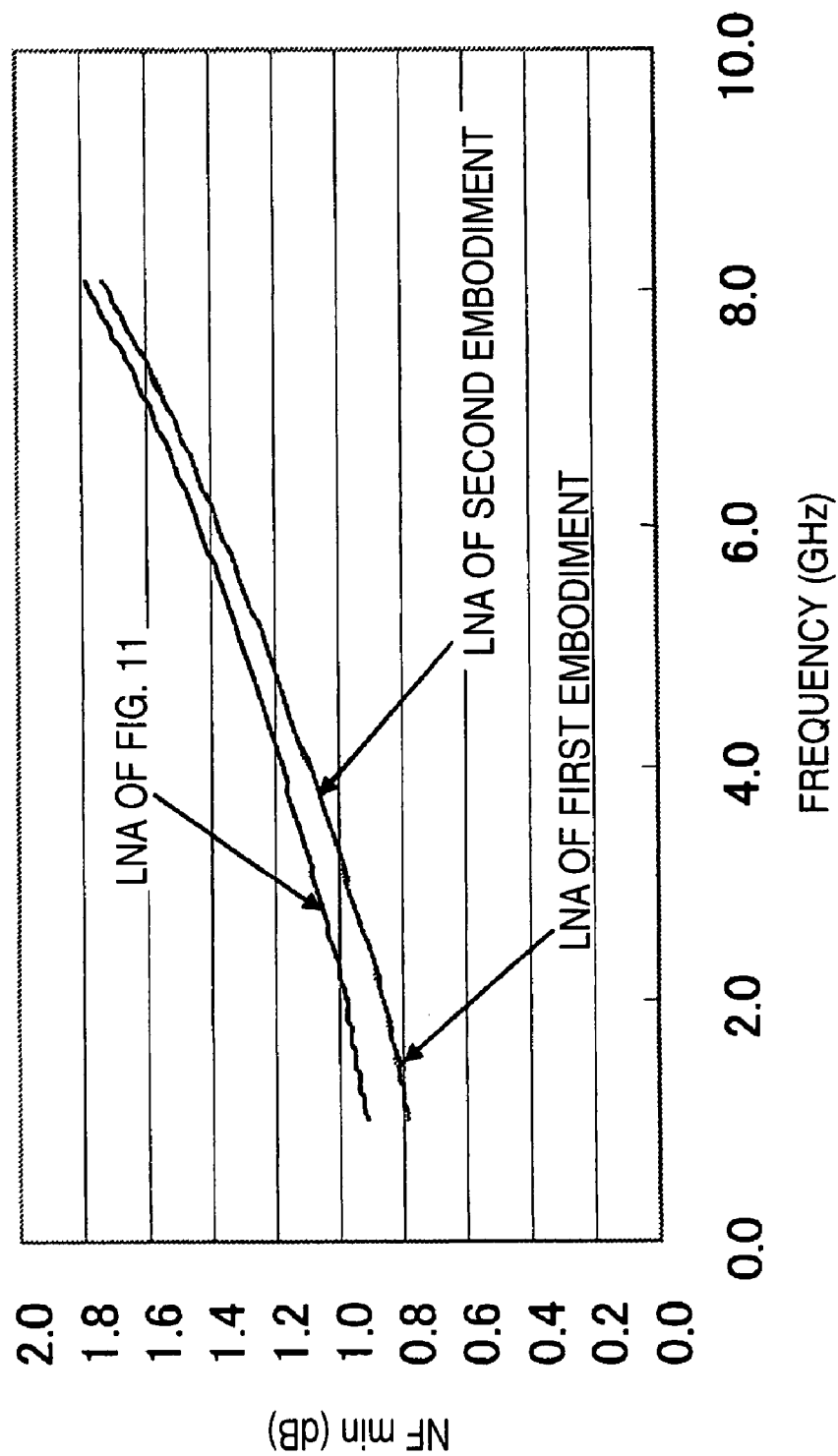
FIG. 5 is a view illustrating the minimum noise figures (NFmin) in the LNAs of the first embodiment, the second embodiment and FIG. 11 over the high frequency areas (the range of 1 GHz to 8 GHz).

FIG. 5 is a view illustrating the minimum noise figures (NFmin) in the LNAs of the first embodiment, the second embodiment and FIG. 11 over the high frequency areas (the range of 1 GHz to 8 GHz).

The resistance value of the resistor R2 preferably is in the range of 1 k to 10 kΩ. If the resistance value of the resistor R2 is less than 11 kΩ, the transistor Q3 is affected by noises from the constant voltage source Vcc1. On the other hand, if the resistance value of the resistor R2 is greater than 10 kΩ, the transistor Q3 would be saturated.

Third Embodiment

Figure 6:
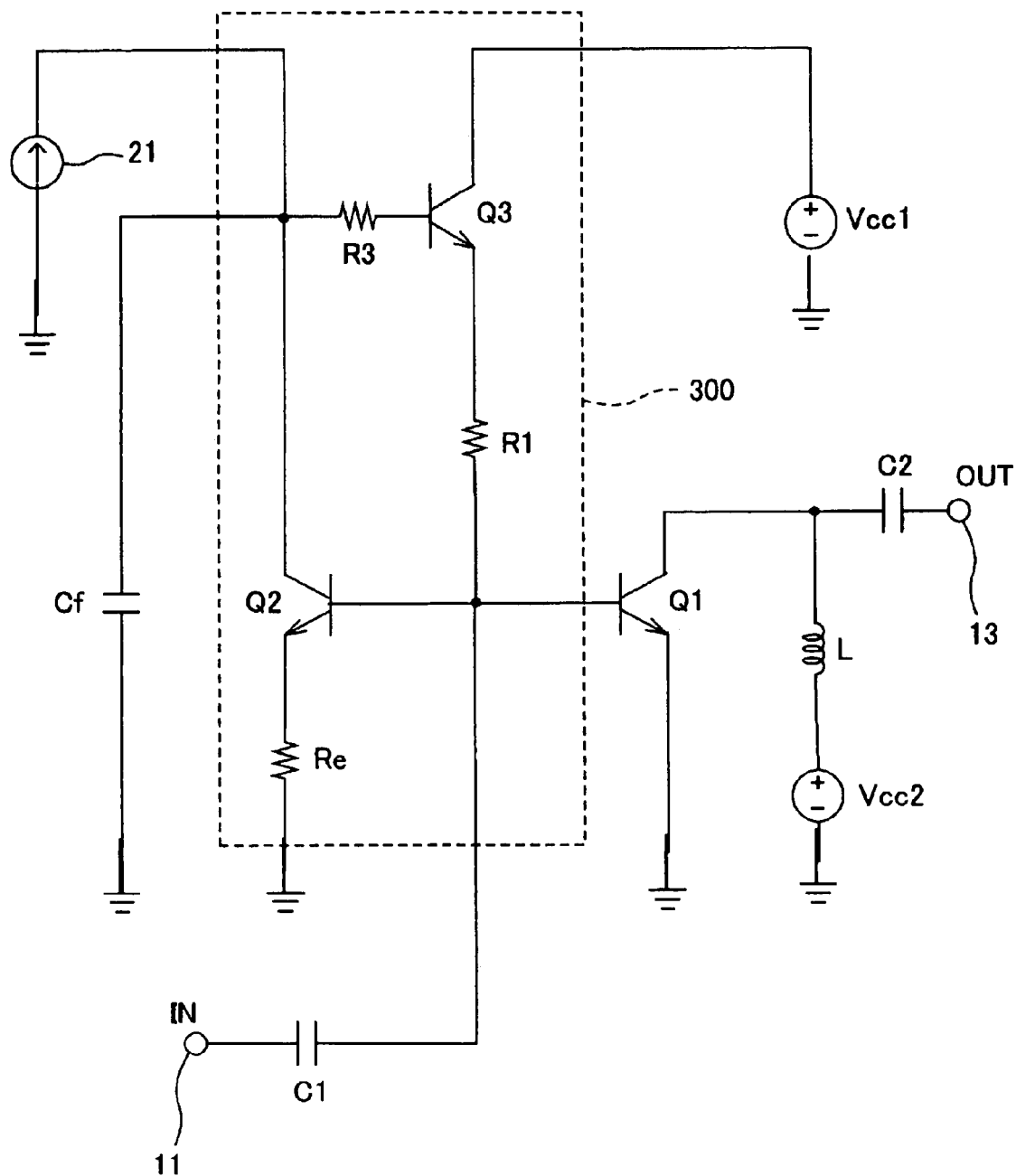
FIG. 6 is a circuit diagram illustrating the LNA according to the third embodiment.

FIG. 6 is a circuit diagram illustrating the LNA according to the third embodiment. The LNA of the third embodiment differs from the LNA of the first embodiment, in that the resistor R3 is connected to the base of the transistor Q3 in the bias circuit 300. The configuration of the third embodiment is the same as the first embodiment besides the aforementioned facts. In FIG. 6, the same reference numerals are denoted to the same components in FIG. 1 and the description thereof will be omitted.

According to this embodiment, the resistor R3 is provided between the base of the transistor Q3 and the constant current sources 21. Thus, the transistor Q3 is not affected by noises from the constant current source 21.

Figure 7:
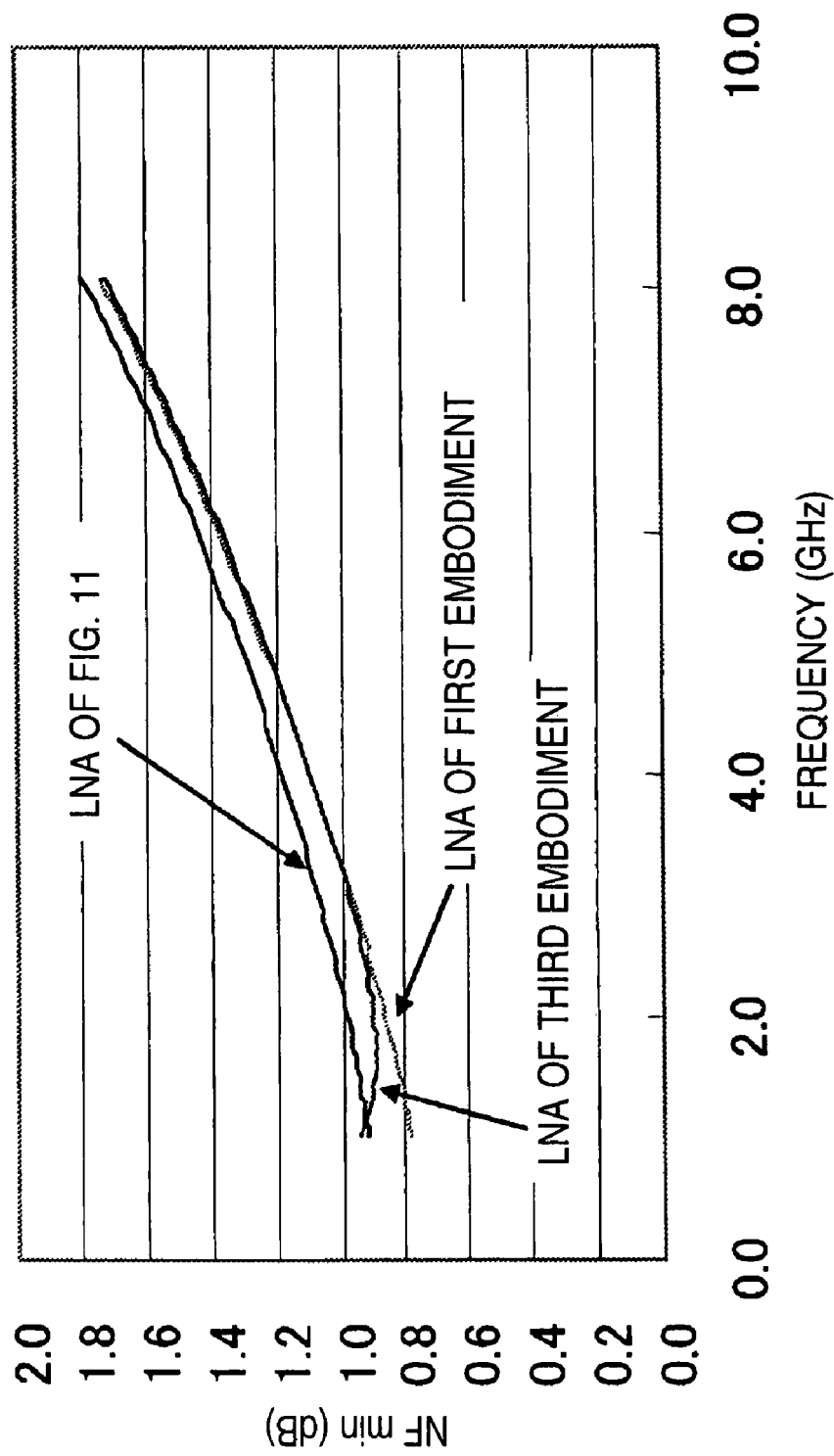
FIG. 7 is a view illustrating the minimum noise figures (NFmin) in the LNAs of the first embodiment, the third embodiment and FIG. 11 over the high frequency areas (the range of 1 GHz to 8 GHz).

FIG. 7 is a view illustrating the minimum noise figures (NFmin) in the LNAs of the first embodiment, the third embodiment and FIG. 11 over the high frequency areas (the range of 1 GHz to 8 GHz).

Like the resistors R2 described in the second embodiment, the resistance value of the resistor R3 is preferably in the range of 1 to 10 kΩ. If the resistance value of the resistor R3 is less than 1 kΩ, the transistor Q3 is affected by noises from the constant current source 21. On the other hand, if the resistance value of the resistor R3 is greater than 10 kΩ, the LNA is oscillated and then a DC characteristic would be unstable.

Figure 8:
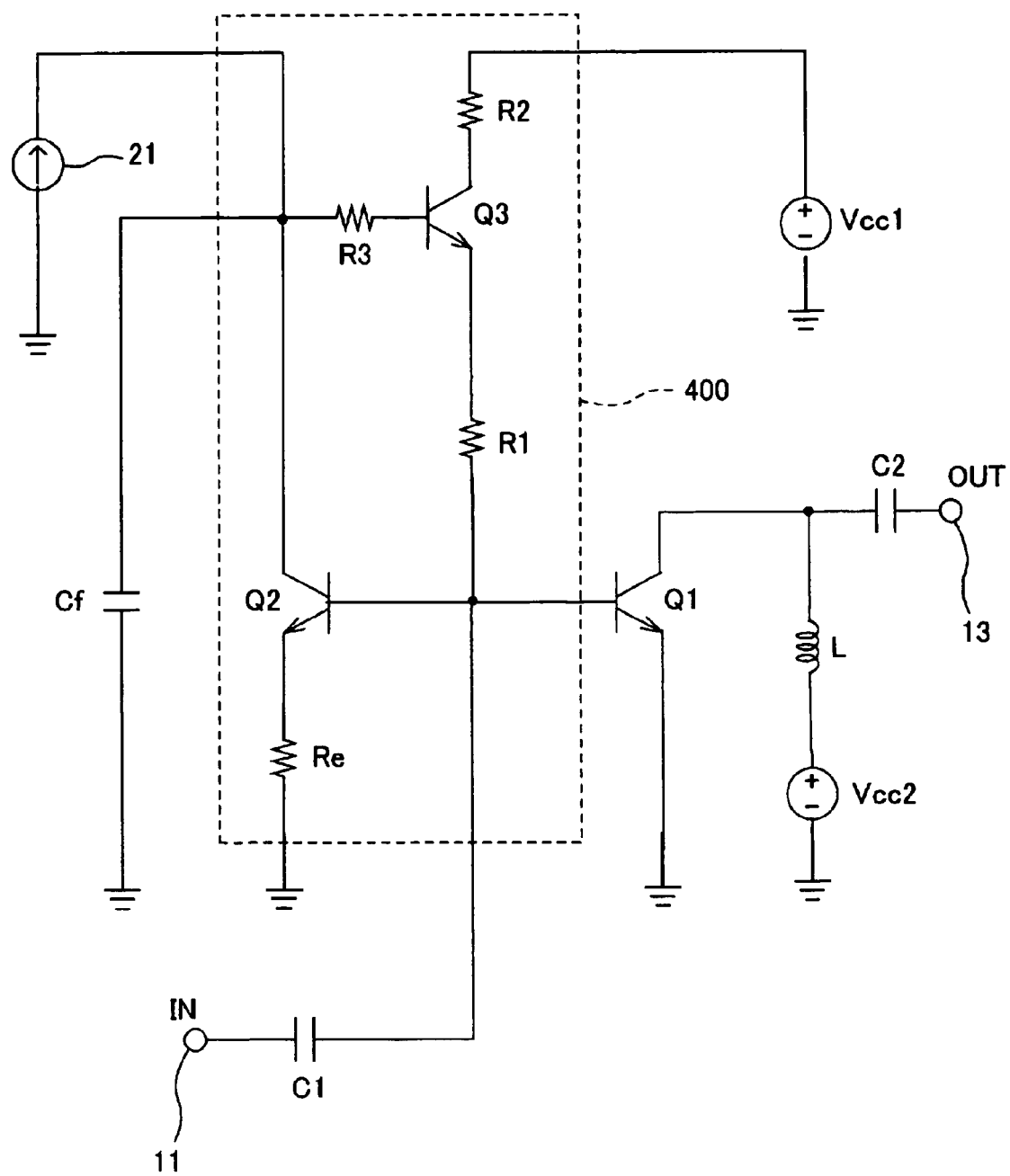
FIG. 8 is a circuit diagram illustrating the LNA which uses both of the resistor R2 of the second embodiment and the resistor R3 of the third embodiment.
Figure 9:
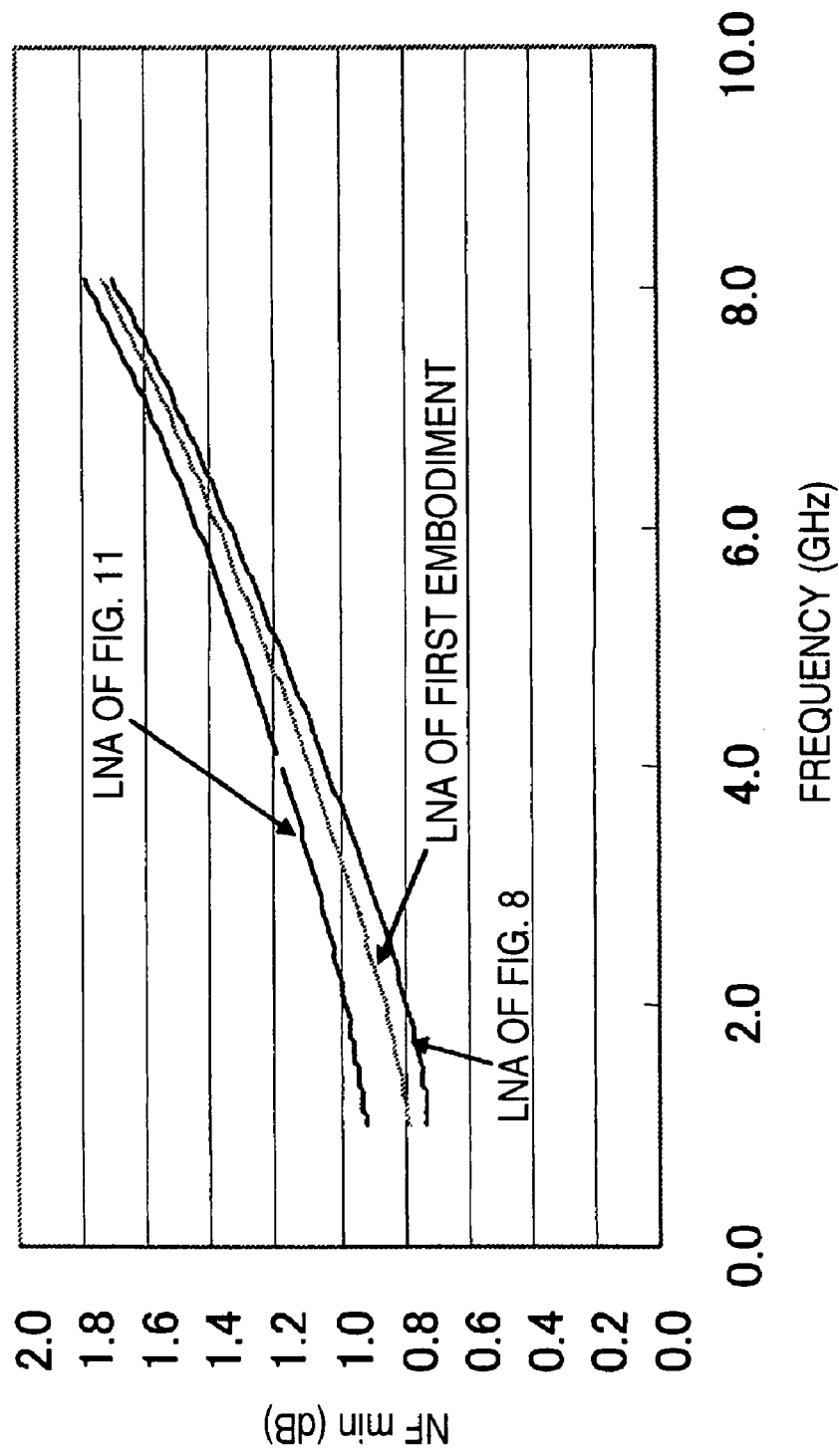
FIG. 9 is a view illustrating the minimum noise figures (NFmin) in the LNA shown in FIG. 8, the LNA of the first embodiment, the LNA of FIG. 11 over the high frequency areas (the range of 1 GHz to 8 GHz).

Like the bias circuits 400 shown in FIG. 8, the bias circuit may include both of the resistor R2 described in the second embodiment and the resistor R3 described in this embodiment. FIG. 9 is a view illustrating the minimum noise figures (NFmin) in the LNA shown in FIG. 8, the LNA of the first embodiment, the LNA of FIG. 11 over the high frequency areas (the range of 1 GHz to 8 GHz). As shown in FIG. 9, the LNA shown in FIG. 8 has a good NF characteristic rather than any one of the LNAs of the first to third embodiments.

According to the aforementioned first to second embodiments, the current mirror circuit includes two transistors Q1 and Q2. However, a multiple output-type current mirror circuit may be employed in which a plurality of transistors similar to the transistor Q1 are disposed in parallel. In addition, when the transistors Q1 of 3 or more are provided, like the transistor Q2, the transistors may be plurally provided in parallel.

Additionally, the transistors Q1 to Q3 all have been described to be a NPN-type HBT. Alternatively, a NPN type HBT may be used as both of the transistors Q1 and Q2, and also a NPN type bipolar transistor may be used as the transistor Q3. A superior NF characteristic can be obtained, when the HBT having a good high-frequency characteristic is employed.

Figure 10:
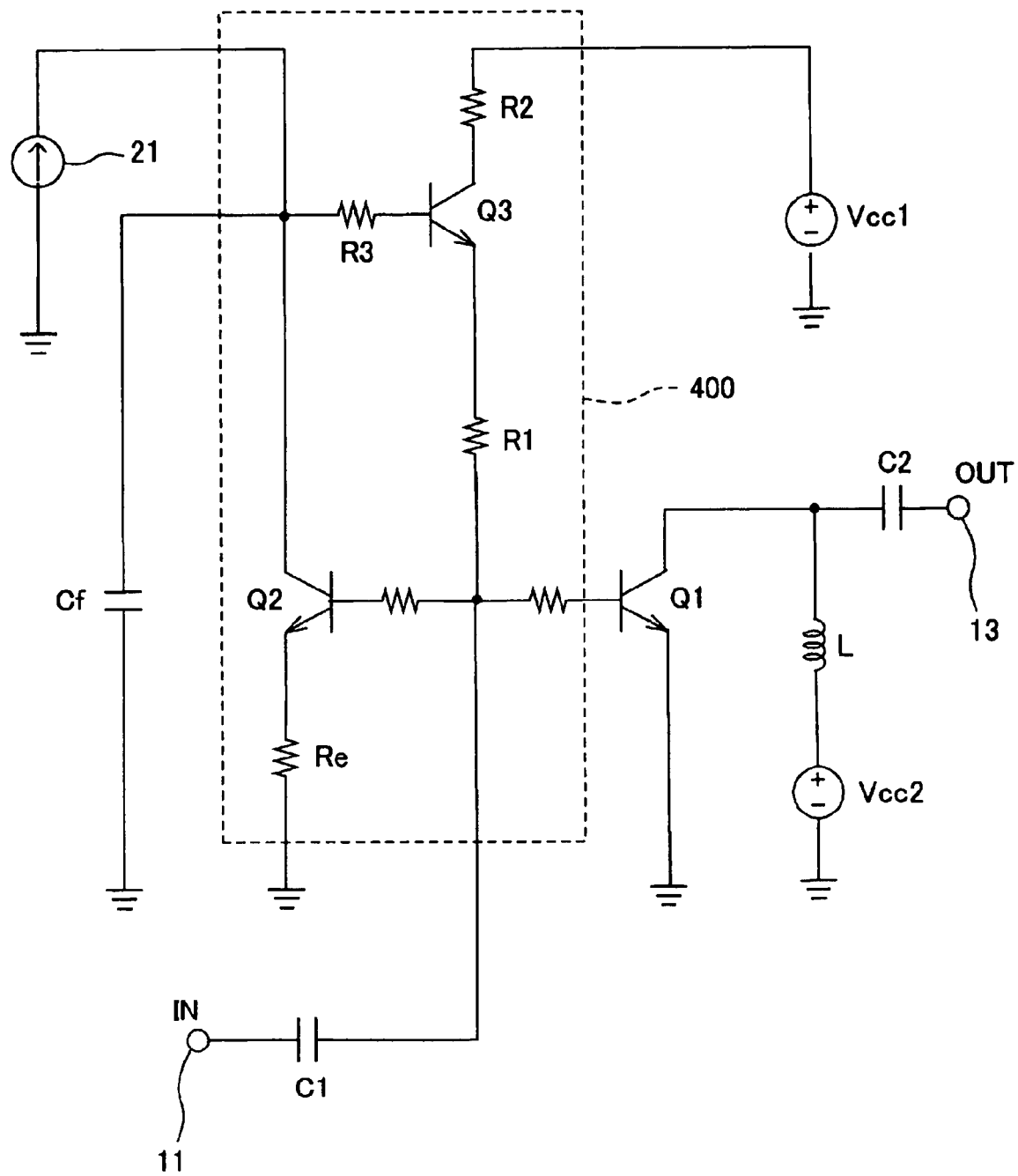
FIG. 10 is a circuit diagram illustrating the LNA in which a resistor is connected to both of the base of transistor Q1 and the base of the transistor Q2.

The resistor may be provided to any one or both of the base of the transistor. Q1 and the base of the transistor Q2, when the $h_{FE}$ of the transistor Q1 and the $h_{FE}$ of the transistor Q2 are different from each other. FIG. 10 is a circuit diagram illustrating the LNA in which a resistor is provided to both of the base of transistor Q1 and the base of the transistor Q2. Such provided resistor allows compensating the difference ($\Delta h_{FE}$) between the $h_{FE}$ of the transistor Q1 and the $h_{FE}$ of the transistor Q2.

While the LNA has been described by using the amplifier circuit according to the invention as an example in the above-mentioned description, a power amplifier also may be used.

While the aforementioned LNA has been described by using an integrated circuit in which the transistor, the resistor etc. are integrated in a single chip, the resistor may be formed externally. In addition, while the bipolar transistors formed of silicon-germanium has been described, the heterojunction bipolar transistor may be used which is integrated onto a compound semiconductor substrate formed of gallium, arsenic, etc., when integrated with optical devices, etc. Further, the LNA may be manufactured as a hybrid integrated circuit in which a discrete part, such as a transistor or a resistor is mounted on a substrate depending on various design circumstances.

The amplifier circuits according to the invention are equally applicable to an LNA or a power amplifier which needs an excellent NF characteristic in a high frequency area.

This application is based upon and claims the benefit of priority of Japanese Patent Application No. 2006-161067 filed on Jun. 9, 2006, the contents of which are incorporated herein by reference in its entirety.

What is claimed is:
1. An amplifier circuit, comprising:
a first bipolar transistor of which the emitter is grounded; and
a bias circuit of the first bipolar transistor,
wherein the bias circuit includes
a second bipolar transistor constituting a current mirror circuit along with the first bipolar transistor, a first resistor connected to the bases of the first bipolar transistor and the second bipolar transistor, and a third bipolar transistor of which the emitter is connected to the bases of the first bipolar transistor and the second bipolar transistor through the first resistor, and of which the base is connected to the collector of the second bipolar transistor, wherein the first bipolar transistor amplifies a signal input to the base thereof and then outputs the amplified signal from the collector of the first bipolar transistor, and a voltage is applied from a voltage source to the collector of the third bipolar transistor and the bias circuit has a second resistor connected to the collector of the third bipolar transistor.

2. The amplifier circuit according to claim 1, wherein a current is applied from a constant current source to the collector of the second bipolar transistor and the base of the third bipolar transistor and the bias circuit has a third resistor connected to the base of the third bipolar transistor.

3. The amplifier circuit according to claim 1, wherein the bias circuit has a fourth resistor connected to the emitter of the second bipolar transistor and the emitter of the second bipolar transistor is connected to the ground via the fourth resistor.

4. The amplifier circuit according to claim 1, wherein a plurality of the first bipolar transistors are provided, and the plurality of first bipolar transistors are disposed in parallel to the second bipolar transistor.

5. The amplifier circuit according to claim 4, wherein includes a plurality of the second bipolar transistors, and the plurality of second bipolar transistors are disposed in parallel to the first bipolar transistor.

6. The amplifier circuit according to claim 1, wherein the first bipolar transistor and the second bipolar transistor are a heterostructure bipolar transistor.

7. The amplifier circuit according to claim 1, wherein the bias circuit has a fifth resistor connected between the base of the second bipolar transistor and the first resistor.

8. The amplifier circuit according to claim 1, wherein the bias circuit has a sixth resistor connected between the base of the first bipolar transistor and the first resistor.

9. The amplifier circuit according to claim 7, wherein the bias circuit has a sixth resistor connected between the base of the first bipolar transistor and the first resistor.

10. The amplifier circuit according to claim 1, wherein the amplifier circuit is an integrated circuit in which the first bipolar transistor and the bias circuit are integrated in a single chip.

11. An amplifier circuit, comprising:
a first bipolar transistor of which the emitter is grounded; and
a bias circuit of the first bipolar transistor,
wherein the bias circuit includes
a second bipolar transistor constituting a current mirror circuit along with the first bipolar transistor,
a first resistor connected to the bases of the first bipolar transistor and the second bipolar transistor, and
a third bipolar transistor of which the emitter is connected to the bases of the first bipolar transistor and the second bipolar transistor through the first resistor, and of which the base is connected to the collector of the second bipolar transistor,
wherein the first bipolar transistor amplifies a signal input to the base thereof and then outputs the amplified signal from the collector of the first bipolar transistor, and
a current is applied from a constant current source to the collector of the second bipolar transistor and the base of the third bipolar transistor and the bias circuit has a third resistor connected to the base of the third bipolar transistor.

12. The amplifier circuit according to claim 11, wherein the bias circuit has a fourth resistor connected to the emitter of the second bipolar transistor and the emitter of the second bipolar transistor is connected to the ground via the fourth resistor.

13. The amplifier circuit according to claim 11, wherein a plurality of the first bipolar transistors are provided, and the plurality of first bipolar transistors are disposed in parallel to the second bipolar transistor.

14. The amplifier circuit according to claim 13, wherein includes a plurality of the second bipolar transistors, and the plurality of second bipolar transistors are disposed in parallel to the first bipolar transistor.

15. The amplifier circuit according to claim 11, wherein the first bipolar transistor and the second bipolar transistor are a heterostructure bipolar transistor.

16. The amplifier circuit according to claim 11, wherein the bias circuit has a fifth resistor connected between the base of the second bipolar transistor and the first resistor.

17. The amplifier circuit according to claim 16, wherein the bias circuit has a sixth resistor connected between the base of the first bipolar transistor and the first resistor.

18. The amplifier circuit according to claim 11, wherein the bias circuit has a sixth resistor connected between the base of the first bipolar transistor and the first resistor.

19. The amplifier circuit according to claim 11, wherein the amplifier circuit is an integrated circuit in which the first bipolar transistor and the bias circuit are integrated in a single chip.

20. An amplifier circuit, comprising:
a first bipolar transistor of which the emitter is grounded; and
a bias circuit of the first bipolar transistor,
wherein the bias circuit includes
a second bipolar transistor constituting a current mirror circuit along with the first bipolar transistor,
a first resistor connected to the bases of the first bipolar transistor and the second bipolar transistor, and
a third bipolar transistor of which the emitter is connected to the bases of the first bipolar transistor and the second bipolar transistor through the first resistor, and of which the base is connected to the collector of the second bipolar transistor, and
a capacitor connected to the collector of the second bipolar transistor,
wherein the first bipolar transistor amplifies a signal input to the base thereof and then outputs the amplified signal from the collector of the first bipolar transistor.

21. amplifier circuit according to claim 20, wherein the bias circuit has a fourth resistor connected to the emitter of the second bipolar transistor and the emitter of the second bipolar transistor is connected to the ground via the fourth resistor.

22. The amplifier circuit according to claim 20, wherein a plurality of the first bipolar transistors are provided, and the plurality of first bipolar transistors are disposed in parallel to the second bipolar transistor.

23. The amplifier circuit according to claim 22, wherein includes a plurality of the second bipolar transistors, and the plurality of second bipolar transistors are disposed in parallel to the first bipolar transistor.

24. The amplifier circuit according to claim 20, wherein the first bipolar transistor and the second bipolar transistor are a heterostructure bipolar transistor.

25. The amplifier circuit according to claim 20, wherein the bias circuit has a fifth resistor connected between the base of the second bipolar transistor and the first resistor.

26. The amplifier circuit according to claim 25, wherein the bias circuit has a sixth resistor connected between the base of the first bipolar transistor and the first resistor.

27. The amplifier circuit according to claim 20, wherein the bias circuit has a sixth resistor connected between the base of the first bipolar transistor and the first resistor.

28. The amplifier circuit according to claim 20, wherein the amplifier circuit is an integrated circuit in which the first bipolar transistor and the bias circuit are integrated in a single chip.

* * * * *